United States Patent
LaClair et al.

(10) Patent No.: US 7,170,385 B2
(45) Date of Patent: Jan. 30, 2007

(54) INDUCTIVE PROXIMITY SENSOR AND METHOD OF ASSEMBLING THE SAME

(75) Inventors: Robert Downing LaClair, Richmond, VT (US); David Henry Crowne, Weybridge, VT (US); Christopher Spagnoletti, Stowe, VT (US); Eric Carter, Panton, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 10/991,710

(22) Filed: Nov. 18, 2004

(65) Prior Publication Data

US 2006/0103499 A1    May 18, 2006

(51) Int. Cl.
*H01F 27/30* (2006.01)
(52) U.S. Cl. ..................................... 336/208
(58) Field of Classification Search ................. 336/208
See application file for complete search history.

(56) References Cited

U.S. PATENT DOCUMENTS

| | | | | |
|---|---|---|---|---|
| 3,327,264 A | * | 6/1967 | Rodaway | 335/188 |
| 3,546,399 A | * | 12/1970 | Kuehn et al. | 369/136 |
| 3,564,542 A | * | 2/1971 | Arai | 340/384.73 |
| 4,394,636 A | * | 7/1983 | Hiraku et al. | 336/172 |
| 5,659,246 A | * | 8/1997 | Togo et al. | 324/207.15 |
| 6,927,660 B2 | * | 8/2005 | Okamoto | 336/192 |
| 2003/0080844 A1 | * | 5/2003 | Nishikawa et al. | 336/178 |

\* cited by examiner

*Primary Examiner*—Elvin Enad
*Assistant Examiner*—Joselito Baisa
(74) *Attorney, Agent, or Firm*—Calfee, Halter & Griswold LLP; Peter M. Hernandez (57) ABSTRACT

An inductive proximity sensor comprises: a housing including an opening on one side; an inductive core including two legs, each core leg including a foot portion; an inductive coil wound bobbin disposed about each leg of the core, each bobbin including an integral ledge cantilevered from an inside surface of the bobbin for forming a pocket under the integral ledge at a bottom of the bobbin for containing the foot portion of the corresponding core leg; a thruster element including a top surface and two legs, each thruster leg disposed into a respective bobbin resting on the integral ledge thereof, the core, wound bobbins and thruster element disposed in the housing; a spring element disposed on the top surface of the thruster element at the housing opening; and a housing cover disposed over the housing opening for compressing the spring element against the thruster element which renders the core and wound bobbins in a fixed relationship to each other in the housing. Also disclosed is a method of assembling the proximity sensor.

11 Claims, 7 Drawing Sheets

INDUCTIVE PROXIMITY SENSOR AND METHOD OF ASSEMBLING THE SAME

BACKGROUND OF THE INVENTION

The present invention is directed to inductive proximity sensors in general, and more particularly, to an inductive proximity sensor with induction coils in fixed relationship with an inductive core by compression to avoid: (1) the use of adhesives to secure the induction coils to the inductive core; and (2) adjustment or calibration to achieve the desired inductive output, and method of assembling the same.

Inductive proximity sensors typically comprise a core, which may be "C" or Omega shaped, for example, fabricated from a highly-permeable metal, with two inductive coils on bobbins placed over each leg of the core. The two coils are typically wound around their respective bobbins in opposite directions (one wound clockwise and the other wound counter-clockwise) and electrically connected in series. The series connected coils of the sensor are generally driven by an AC voltage at a desired frequency. The generated coil current, which may be monitored by a current sensing device, is commonly used as an inductive output of the sensor. Generally, the inductive output changes value when a target to be sensed moves from a near to a far position with respect to a sensing face of the sensor, and vice versa. There should be a sufficient change in value of inductive output over the span of operating conditions in order to be able to distinguish between the near and far target positions.

The inductive output of the sensor is determined by several factors, including core material, core geometry, number of turns of coil wire, coil (bobbin) geometry, operating frequency and voltage, coil resistance, sensor housing material, and the relative position of the coils to the core, for example. The significant characteristics of all of the materials used in the sensor as well as the assembly process is controlled so that the assembled sensor may exhibit an established standard inductance (within tolerances). Usually, in order to meet an inductive specification, the sensor assembly or transducer is "calibrated". The calibration may be accomplished in several ways. Three of the most common methods are: 1) move one of the coils along its core leg until the desired inductance is achieved and then secure the bobbin to the core leg with an adhesive, which may be an epoxy, for example; 2) add or remove turns of wire from one or both of the coils until the desired inductance is achieved; and 3) add an adjustable permeable shunt to the assembly which will magnetically interact with the core thereby effecting an adjustment to the transducer inductance. All of these calibration methods include manual intervention by the assembler of the sensor. It would be advantageous, from a manufacturing perspective, to successfully assemble the sensor without the need for calibration.

As noted above, it is currently common practice during calibration to secure the bobbin (on which the coil is wound) to the core leg using an epoxy adhesive. Eliminating this step from the assembly process would significantly increase the reliability of the sensor and reduce manufacturing costs.

The present invention as will be described in greater detail herein below incorporates features including self aligning coils which will allow for the successful assembly of a proximity sensor without calibration, and thus, without the use of an adhesive to secure the coil bobbin to the leg of the core during assembly of the sensor.

SUMMARY OF THE INVENTION

In accordance with one aspect of the present invention, an inductive proximity sensor comprises: a housing including an opening on one side; an inductive core including two legs, each core leg including a foot portion; an inductive coil wound bobbin disposed about each leg of the core, each bobbin including an integral ledge cantilevered from an inside surface of the bobbin for forming a pocket under the integral ledge at a bottom of the bobbin for containing the foot portion of the corresponding core leg; a thruster element including a top surface and two legs, each thruster leg disposed into a respective bobbin resting on the integral ledge thereof, the core, wound bobbins and thruster element disposed in the housing; a spring element disposed on the top surface of the thruster element at the housing opening; and a compressive element disposed over the housing opening for compressing the spring element against the thruster element which renders the core and wound bobbins in a fixed relationship to each other in the housing.

In accordance with another aspect of the present invention, a method of assembling an inductive proximity sensor to maintain inductive coil wound bobbins in fixed relation to an inductive core within a housing comprises the steps of: configuring each of two inductive coil wound bobbins with an integral ledge cantilevered from an inside surface thereof for forming a pocket under the integral ledge at a bottom of each bobbin; disposing each inductive coil wound bobbin around a corresponding leg of the inductive core; containing a foot of each core leg into the pocket of the corresponding bobbin under the integral ledge thereof; inserting each of two legs of a thruster element into a corresponding bobbin, wherein each leg rests upon the ledge of the corresponding bobbin; disposing the inductive core, inductive coil wound bobbins, and thruster element into the housing; disposing a spring element on a top surface of the thruster element; and compressing the spring element against the top surface of the thruster element to render the core and wound bobbins in a fixed relationship to each other in the housing.

DETAILED DESCRIPTION OF THE INVENTION

An exemplary embodiment of a proximity sensor assembly suitable for embodying the broad principles of the present invention will be described in connection with FIGS. 1A, 1B, 1C, 2 and 3. Referring to FIGS. 1A, 1B, 1C, 2 and 3, a pair of coil wound, square cross-sectional bobbins 10 and 12 are disposed over respective legs 14 and 16 of an inductive core 18, which may be C-shaped, for example. Each bobbin is wound with a precise number of turns in order to meet the specified inductance of the proximity sensor. One bobbin, like 10, for example, may be wound with the inductive coil clockwise and the other bobbin, like 12, for example, may be wound with the inductive coil counter-clockwise. The windings of the two bobbins are connected in series and the unconnected inductive coil leads (not shown) are disposed in a housing 20 of the sensor assembly and in turn, connected to respective pins 22 and 24 which pass through a housing wall and become part of a connector 26 which is coupled externally to the wall housing 20. The pins 22 and 24 of connector 26 provide an electrical coupling through the housing wall to the internal series connected inductive coils. Accordingly, an AC voltage at a desired frequency may be applied across the pins 22 and 24 to drive the inductive proximity sensor as will become better understood from the description found herein below.

Figure 1A:
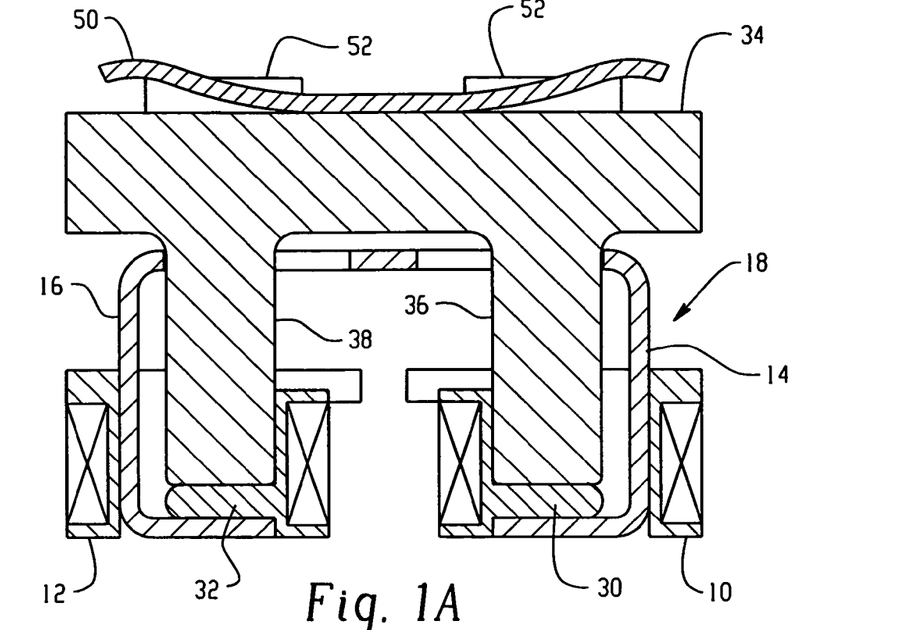
FIGS. 1A and 1B are cross-sectional profile and side views, respectively, of internal components of an exemplary proximity sensor assembly suitable for embodying the broad principles of the present invention.
Figure 1B:
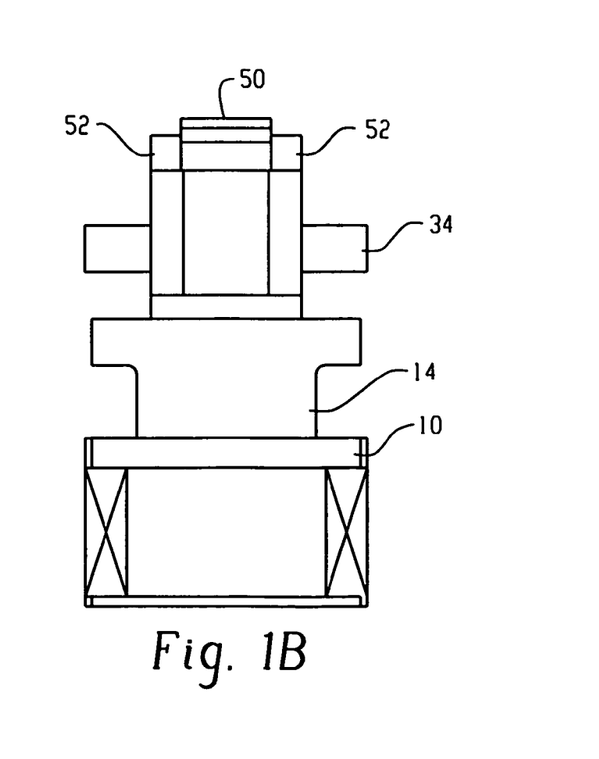
Figure 1C:
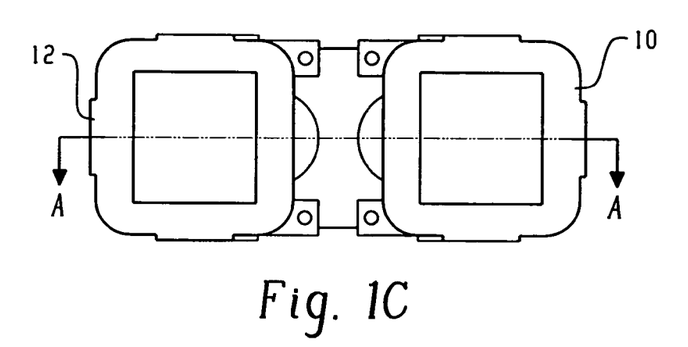
FIG. 1C is a bottom view of the assembled internal components of the exemplary sensor assembly embodiment of FIG. 1.
Figure 2:
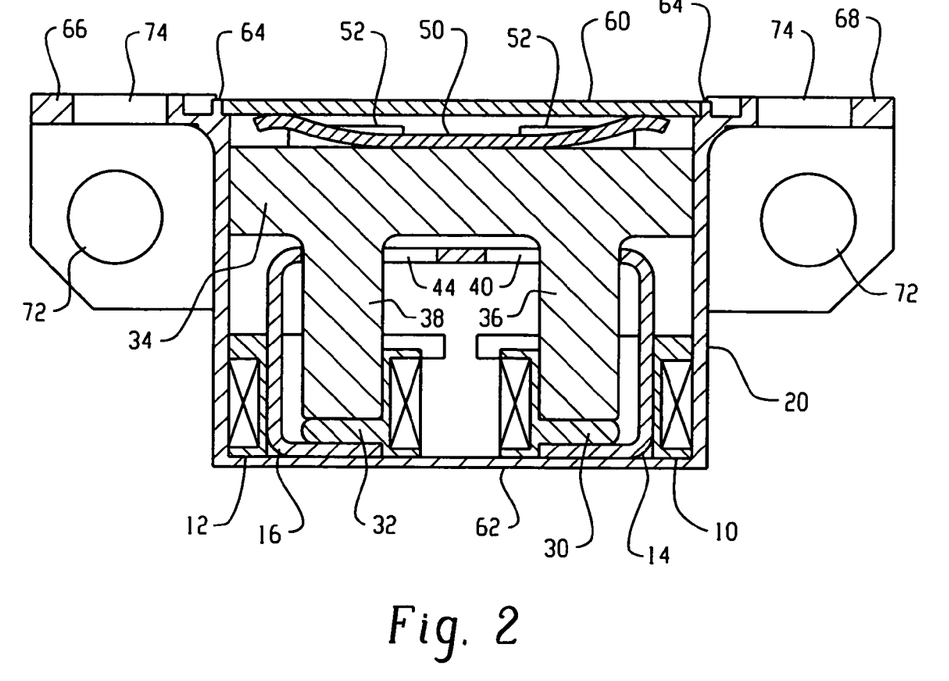
FIG. 2 is a cross-sectional view of the exemplary proximity sensor assembly of FIG. 1 disposed in a sensor housing.

Each bobbin 10 and 12 includes an integral ledge 30 and 32, respectively, which creates a pocket in the bottom of each bobbin into which the foot of the respective leg 14 and 16 may be contained. Each ledge 30 and 32 is configured in the respective bobbin to rest on top of the foot of the respective core leg 14 and 16 as shown in FIG. 1A and 2. Once the core 18 and coil wound bobbins 10 and 12 are assembled and disposed in the housing 20 through an opening 33, a thruster component 34 is added to the assembly. In the present embodiment, the thruster 34 is "pi" shaped comprising legs 36 and 38 which are disposed respectively through openings 40 and 44 on top of the C shaped core 18 and into the bobbins 10 and 12, respectively. The bottoms of the legs 36 and 38 rest respectively on top of the ledges 30 and 32 within the bobbins 10 and 12.

Figure 3:
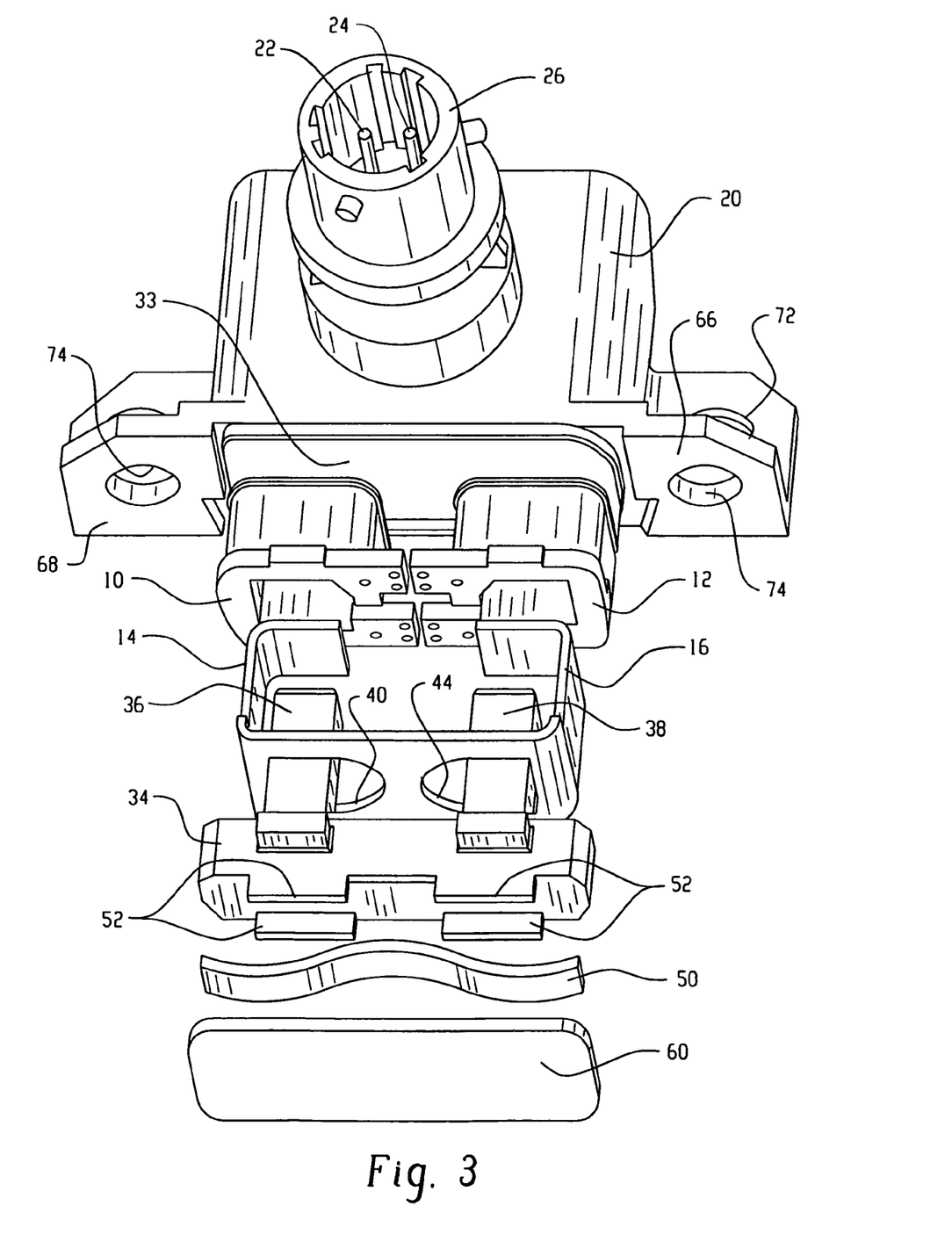
FIG. 3 is an exploded, breakaway isometric view of the components of the exemplary proximity sensor embodiment of FIG. 2.

A spring element 50, which may be a wavy leaf spring, for example, is disposed on top of the "pi" shaped thruster 34 and positioned in place by integral guides 52 which protrude from each side of the top of the thruster 34. The spring element 50 may extend over almost the entire length of the top surface of the thruster 34. After the proximity sensor is assembled in the housing 20, a cover plate 60 is affixed over the housing opening 33, thereby compressing the leaf spring 50 atop the thruster 34 which in turn, applies a downward force on the thruster legs 36 and 38. Each thruster leg 36 and 38, in turn, forces the respective integral bobbin ledge 30 and 32 into the respective foot of the C shaped inductive core 34. This compression ultimately presses each foot of the core 34 onto the internal surface of the sensing wall or face 62 of the sensor housing 20. It is understood that the cover plate 60 is used in the present embodiment only by way of example and that a compressive element other than the cover plate may be used just as well.

The spring element 50 may be designed to withstand the number of g forces called for by a design specification. In the present embodiment, the force, exerted by the leaf spring 50, represents 500 to 1,000 g's (gravitational constants) of preload. In addition, the cover plate 60 may be forced down upon the leaf spring 50 and into an indented rim 64 around the housing opening 33 with a press ram, and tack welded into place, for example. Thereafter, the press ram may be removed and the welding of the cover plate 60 to the rim 64 of the housing opening 33 may be completed. In the present example, the cover plate 60 is flush mounted to the housing wall around the opening 33 affording a permanent sealed chamber within the housing 20 containing the compressed assembly of components of the proximity sensor. This compressed assembly provides self-aligned coils and prevents the sensor components from separating under high shock conditions.

As noted above, each bobbin 10 and 12 includes a square pocket in the bottom thereof to contain the foot of the respective leg 14 and 16 of the C shaped core 34. As the foot of each core leg 14 and 16 fits into a square pocket under the respective ledge 30 and 32 in the bottom of each bobbin 10 and 12, each bobbin 10 and 12 is rotationally constrained under compression. The depth of the square pocket in the bottom of each bobbin 10 and 12 together with the thickness of the material of the core 34 determines the relative position of the inductive coil/bobbin 10 and 12 to the inductive core leg 14 and 16, respectively.

The housing 20 may include L-shaped, winged extensions 66 and 68 at each side thereof. Each side of each L-shaped extension 66 and 68 includes an opening 72 and 74 through which a screw or bolt may be inserted for mounting the sensor assembly to a barrier (not shown). Accordingly, the sensor assembly may be mounted and secured to the barrier depending on the movement of the target to the sensing face 62.

Since the dimensions of the sensor components may be controlled to a high degree of precision, then the relative positions of the bobbin and core leg may be likewise controlled to a high level of precision, i.e. self-aligned. The magnetic properties of the core material, the number of turns of the induction coils, the sensor housing material properties, the core geometry, and all of the aforementioned specifications may be likewise controlled to a high degree of precision. These features will allow the proximity sensor to be successfully fabricated and assembled without in-process calibration and without securing adhesives which will also significantly enhance the survivability of the proximity sensor, particularly in high shock environments.

Normally, inductive proximity sensors similar in design to the sensor described herein above can not operate effectively to monitor the relative position of a target of permeable or magnetic material through barriers of conductive material, like aluminum and copper, for example, due primarily to the operating frequencies thereof. In accordance with another aspect of the present invention, applicant has discovered a method of operating a non-intrusive proximity sensor for monitoring the relative position of a target of permeable or magnetic material through barriers of conductive material. This aspect of the present invention will now be described in connection with FIGS. 4–12.

Figure 4:
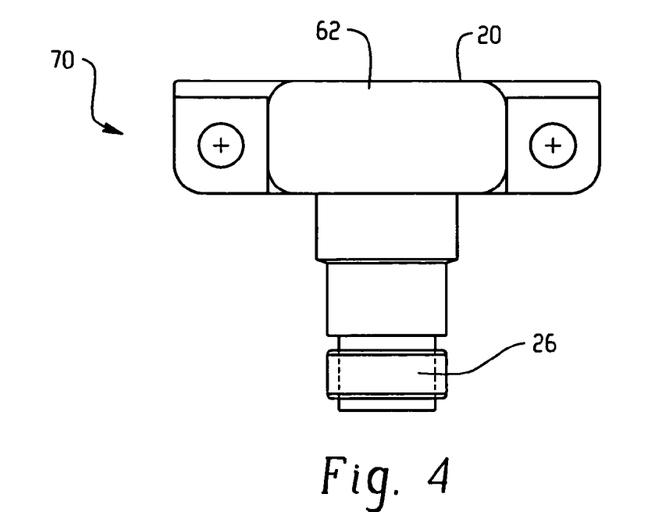
FIG. 4 is an illustration of a proximity sensor suitable for use in another aspect of the present invention.
Figure 5:
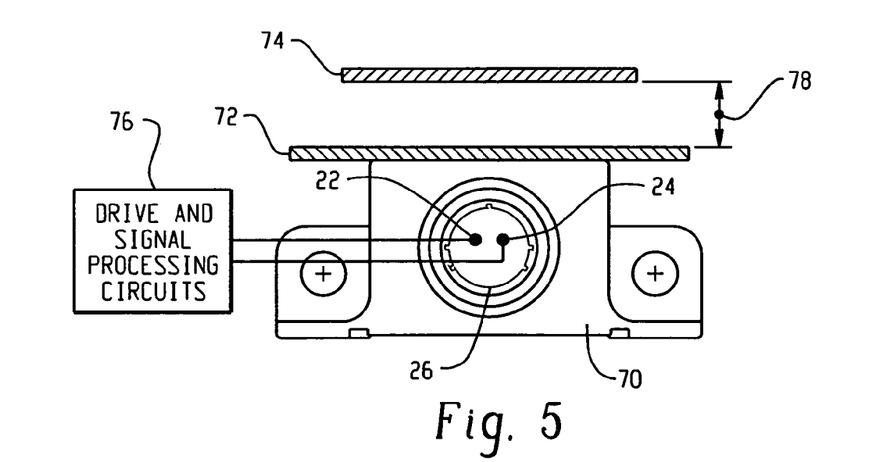
FIG. 5 is an illustration of a non-intrusive proximity sensing configuration suitable for use in the other aspect of the present invention.

A sketch of a proximity sensor 70 suitable for use in the operating method of the present invention is shown in FIG. 4. The proximity sensor 70 may be similar in design to the sensor assembly described herein above and for this reason, common reference numerals will be used for sensor components previously described. For example, the proximity sensor 70 may have a housing 20, a sensing face 62 and an electrical connector 26 as described above. FIG. 5 is a sketch illustrating an application of a non-intrusive application of the proximity sensor 70. Referring to FIG. 5, the proximity sensor 70 is secured in place with the sensing face 62 thereof in juxtaposition with one side of a conductive barrier 72, which may be a wall or bulkhead of an aircraft, for example. A target 74 is positionable relative to the proximity sensor 70 on the other side of the conductive plate 72 so that the sensor 70 may monitor the relative position of the target 74 through the conductive plate 72, i.e. non-intrusively. In addition, a drive and signal processing unit 76 is electrically coupled across the pins 22 and 24 of the connector 26, which pins are electrically coupled to the inductive coils of the sensor 70 as described herein above.

The electronic drive and signal processing unit 76 being used for proximity sensing in the present embodiment may be digital signal processor (DSP) or microprocessor based. The unit 76 may be programmed to output a drive signal via a digital-to-analog (D/A) converter to the sensor 70 (i.e. across pins 22 and 24) at virtually any frequency. Also, it is understood that in an aircraft system, for example, there may be a large number of different proximity sensors all configured for corresponding different non-intrusive proximity sensing applications, such as through conductive barriers of pressure bulkheads, door casings, aircraft skins, composite panels containing a conductive mesh for EMI protection, etc. The present embodiment would also permit operation of proximity sensors in close proximity to conductive side metals such as sensor or target mounting brackets, for example. Accordingly, the different proximity sensors in the system may be all coupled to a common processing unit 76. Such an architecture would allow the common processing unit 76 to be programmed to excite each different individual sensor 70 at a frequency appropriate for its installation configuration. A mechanical actuation distance 78 (sensor/target gap variation during actuation) and the thickness and composition of the material of the barrier 72 would determine the appropriate drive frequency for that particular installation.

Figure 6A:
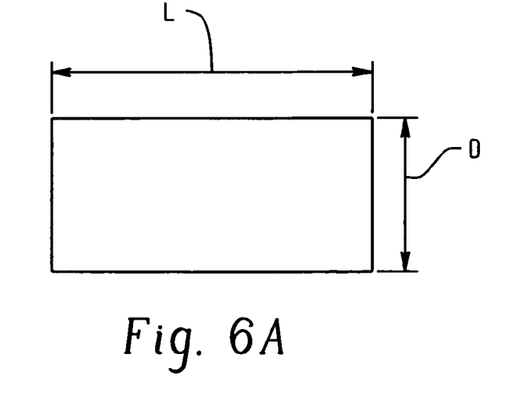
FIGS. 6a and 6B are illustrations depicting plan and side views, respectively, of a target for use in the other aspect of the present invention.
Figure 6B:
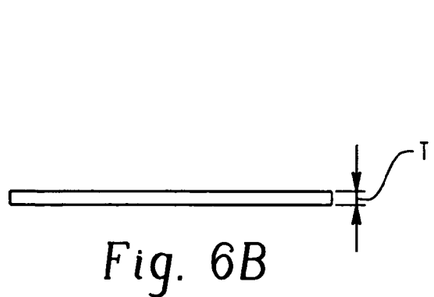

In the present embodiment, the target 74 may be a conventional plate of permeable or magnetic material, like a ferrous material, for example, as shown in the plan and side views of FIGS. 6A and 6B, respectively. The length L, width W and thickness T of the target plate 72 for the present example are 1.50 inches, 0.75 inches and 0.10 inches, respectively.

Figure 7:
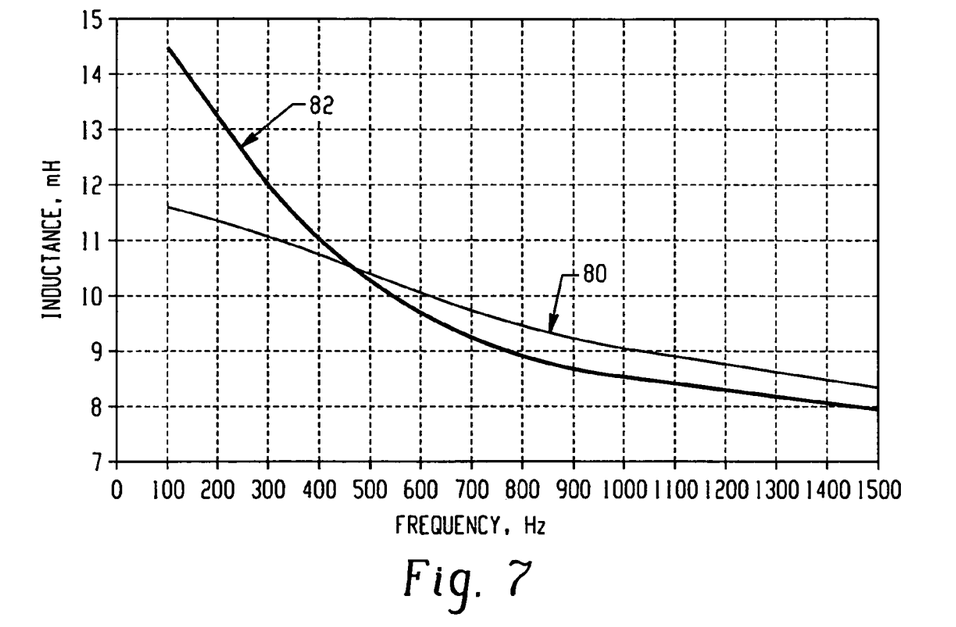
FIGS. 7–9 are graphs of measured sensor inductance vs. drive frequency for different test conditions in accordance with the other aspect of the present invention.

Tests were conducted on the proximity sensing configuration of FIG. 5 which illustrates an orientation of the proximity sensor 70, the conductive barrier 72, and the standard ferrous target 74 which is positionable relative to the sensor 70. The sensor 70 is interfaced with the processing unit 76 which may include a programmable LCR bridge capable of measuring the inductance or inductive output of the sensor 70 at various drive frequencies. FIG. 7 is a graph of measured sensor inductance vs. drive frequency for two test conditions using an 0.062 inch thick aluminum conductive barrier 72. In FIG. 7, line 80 exemplifies the test results of the proximity sensor inductance with the conductive barrier 72 in place and no target 74 present (i.e. indicative of a "far" position); and line 82 exemplifies the test results of the proximity sensor inductance with the conductive barrier 72 in place and the target 74 present (i.e. indicative of a "near" position). Note that at or below drive frequencies of approximately 350 Hz, the measured inductances of the two conditions 80 and 82 are sufficiently distinguishable for proximity sensing operation.

Figure 8:
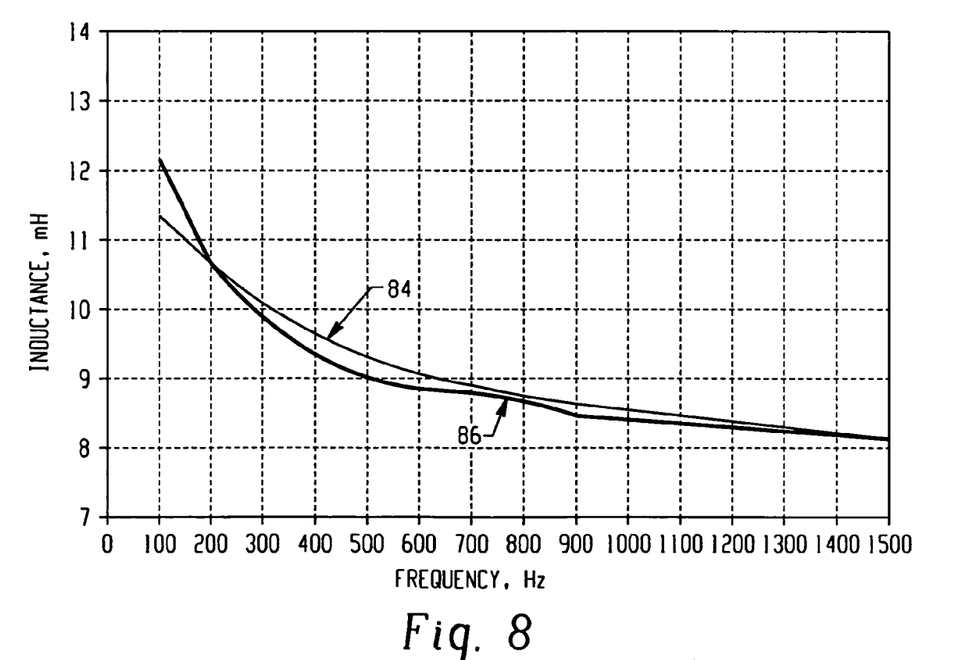

FIG. 8 is a graph of measured sensor inductance vs. drive frequency for another two test conditions using a 0.125 inch thick aluminum conductive barrier 72. In FIG. 8, line 84 exemplifies the test results of the proximity sensor inductance with the conductive barrier 72 in place and no target 74 present (i.e. indicative of a "far" position); and line 86 exemplifies the test results of the proximity sensor inductance with the conductive barrier 72 in place and the target 74 present (i.e. indicative of a "near" position). Note that at or below drive frequencies of approximately 100 Hz, the measured inductances of the two conditions 84 and 86 are sufficiently distinguishable for proximity sensing operation.

Figure 9:
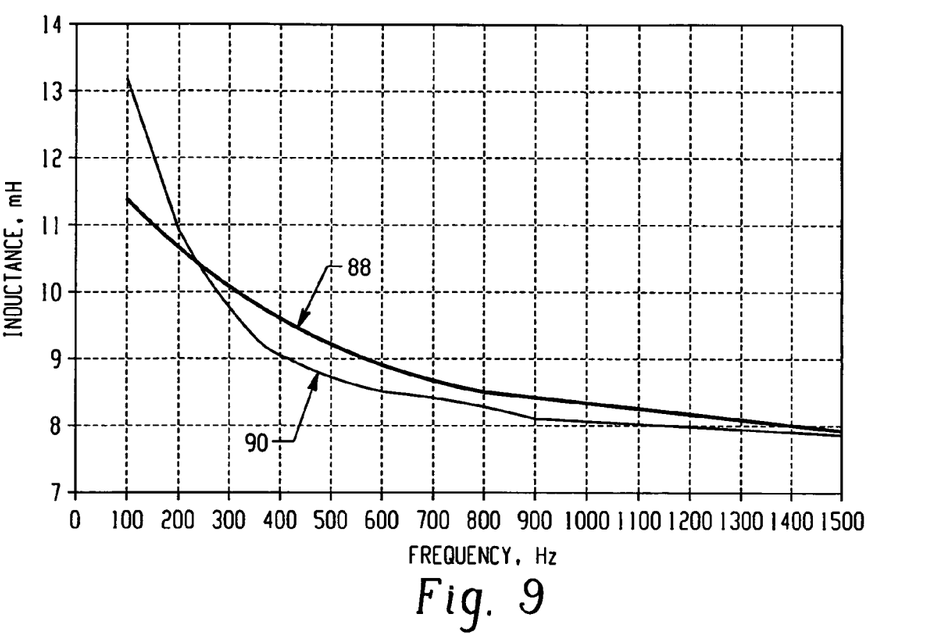

FIG. 9 is a graph of measured sensor inductance vs. drive frequency for yet another two test conditions using an 0.062 inch thick copper conductive barrier 72. In FIG. 9, line 88 exemplifies the test results of the proximity sensor inductance with the conductive barrier 72 in place and no target 74 present (i.e. indicative of a "far" position); and line 90 exemplifies the test results of the proximity sensor inductance with the conductive barrier 72 in place and the target 74 present (i.e. indicative of a "near" position). Note that at or below drive frequencies of approximately 150 Hz, the measured inductances of the two conditions 84 and 86 are sufficiently distinguishable for proximity sensing operation.

Figure 10:
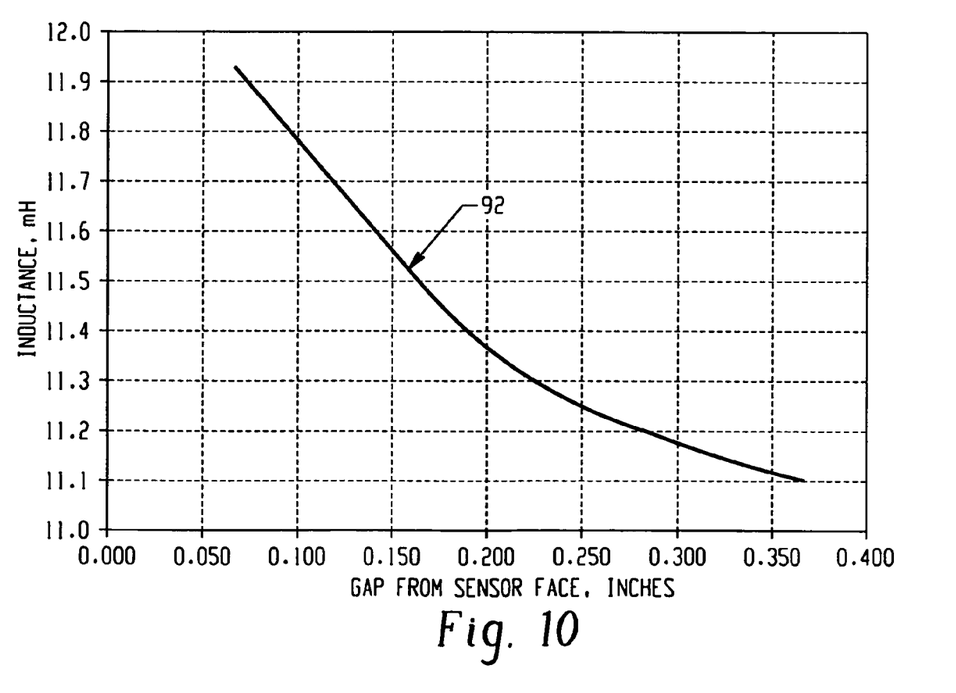
FIGS. 10–12 are graphs of measured sensor inductance vs. target gap for additional test conditions in accordance with the other aspect of the present invention.
Figure 11:
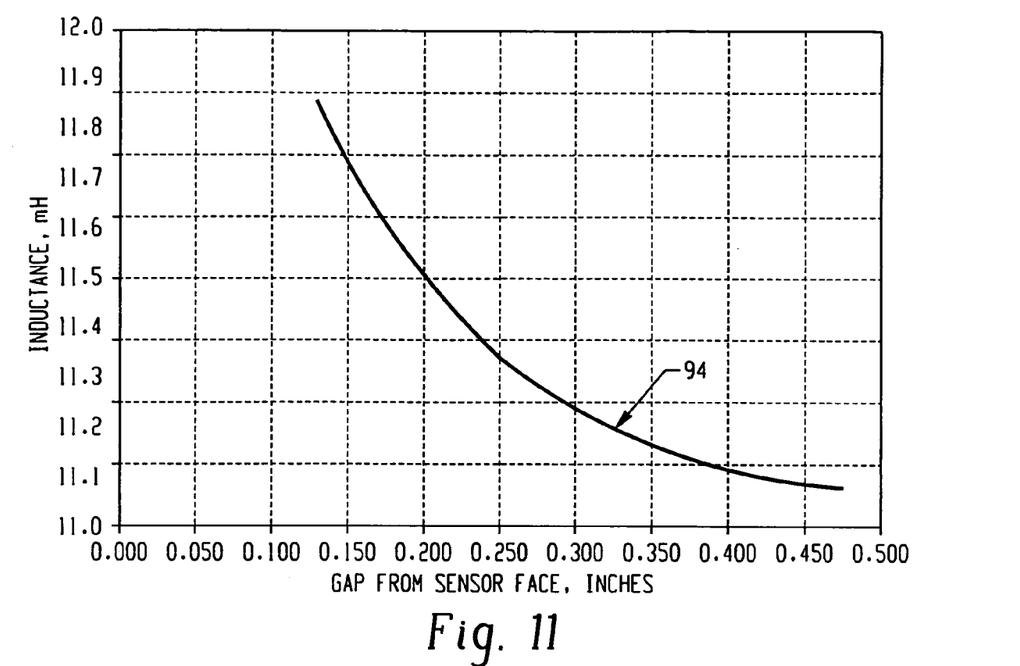
Figure 12:
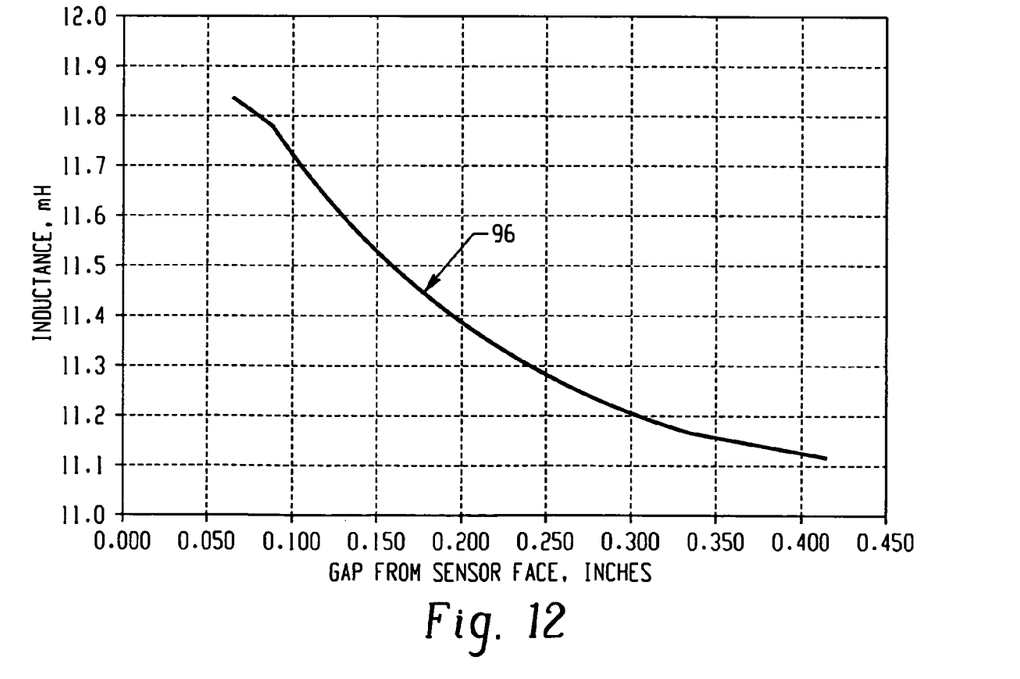

For the foregoing described tests, sensor inductance was measured with the standard target 74 located immediately adjacent to the conductive barrier 72 which is representative of the target in the "near" position in a typical mechanical actuation. The graphs of FIGS. 10–12 represent three additional test conditions performed whereby the target 74 is incrementally moved away from the conductive barrier 72 which is representative of a typical mechanical actuation where the target moves from the "near" position to the "far" position. The graphs of FIGS. 10–12 indicate the total available inductance bandwidth in a typical application at the selected drive frequency.

Line 92 of FIG. 10 exemplifies test results of sensor inductance vs. gap 78 at a drive frequency of 300 Hz using a 0.062 inch thick aluminum conductive barrier 72. Note that the test results indicate an available inductance bandwidth of approximately 800 microHenries for a change in gap 78 from 0.062 to 0.35 inches. Line 94 of FIG. 11 exemplifies test results of sensor inductance vs. gap 78 at a drive frequency of 100 Hz using a 0.125 inch thick aluminum conductive barrier 72. Note that the test results indicate an available inductance bandwidth of approximately 630 microHenries for a change in gap 78 from 0.125 to 0.475 inches. Line 96 of FIG. 12 exemplifies test results of sensor inductance vs. gap 78 at a drive frequency of 150 Hz using a 0.063 inch thick copper conductive barrier 72. Note that the test results indicate an available inductance bandwidth of approximately 700 microHenries for a change in gap 78 from 0.062 to 0.400 inches.

The above described test results demonstrate that, for drive frequencies less than 350 Hz (depending on the barrier material and its thickness), eddy current effects caused by non-intrusive proximity sensing through a conductive barrier may be reduced to a level where reliable proximity sensing can be achieved. From the particular set of tests it is observed that a minimum operating bandwidth for the proximity sensing is approximately 400 microHenries of inductance. This minimum allows for reasonable system tolerances and built in test (BITE) information. The operating inductance bandwidth may be determined by driving the proximity sensor at a selected frequency based on the material and thickness of the conductive barrier and measuring the sensor inductance with the conductive barrier in place and under the two conditions of: (1) no target on the opposing side of the barrier (i.e. "far" position); and (2) a standard sized permeable or magnetic target placed in close proximity to or against the opposing side of the conductive barrier (i.e. the side opposite the side on which the sensor is mounted) which is indicative of a "near" position. The measured inductance value without the target present (far position) is subtracted from the measured inductance value with the standard target present (near position). Note that the operating inductance bandwidth of the sensor is associated with the selected drive frequency.

While the present invention has been described herein above in connection with one or more embodiments, it is understood that the description is merely by way of example with no intent on limiting the present invention in any way to any single embodiment. Rather, the present invention should be construed in breadth and broad scope in accordance with the recitation of the claims appended hereto.

What is claimed is:

1. An inductive proximity sensor comprising:
   a housing including an opening on one side;
   an inductive core including two legs, each core leg including a foot portion;
   an inductive coil wound bobbin disposed about each leg of said core, each bobbin including an integral ledge cantilevered from an inside surface of said bobbin for forming a pocket under said integral ledge at a bottom of said bobbin for containing the foot portion of said corresponding core leg;
   a thruster element including a top surface and two legs, each thruster leg disposed into a respective bobbin resting on the integral ledge thereof, said core, wound bobbins and thruster element disposed in said housing;
   a spring element disposed on the top surface of said thruster element at the housing opening; and
   a compressive element disposed over the housing opening for compressing said spring element against said thruster element which renders said core and wound bobbins in a fixed relationship to each other in said housing.

2. The proximity sensor of claim 1 wherein the spring element compresses the legs of the thruster element downward on the respective integral ledges which in turn compresses the ledges against the feet of the legs of said core which in turn compresses the feet against a bottom internal surface of the housing, thereby maintaining the core and wound bobbins in a fixed relationship to each other by compression.

3. The proximity sensor of claim 1 wherein the core includes a top portion;
   and wherein the legs of the thruster element are disposed down through respective openings in said top portion and into the respective bobbins.

4. The proximity sensor of claim 1 wherein the core comprises a C-shaped core.

5. The proximity sensor of claim 4 wherein the bobbins are rectangular shaped.

6. The proximity sensor of claim 4 wherein the formed pockets in the bobbins are shaped to fit the feet of the legs of the C-shaped core.

7. The proximity sensor of claim 1 wherein the thruster element is "pi" shaped.

8. The proximity sensor of claim 1 wherein the spring element comprises a wavy, leaf spring having a width and length sufficient to spread the compression force thereof substantially over the top surface of the thruster element; and wherein the compressive element
   comprises a housing cover.

9. The proximity sensor of claim 8 wherein the thruster element includes guides along the top surface thereof to maintain the position of the spring element along a length of the top surface.

10. The proximity sensor of claim 1 wherein the housing cover is secured to the housing to maintain the compressive force on the spring element.

11. The proximity sensor of claim 1 wherein the housing includes a connector attached to an outside wall thereof, said connector including connector pins which pass through said housing wall for connecting to the inductive coils wound around the bobbins.

* * * * *